US006230903B1

(12) United States Patent
Abbott

(10) Patent No.: US 6,230,903 B1
(45) Date of Patent: May 15, 2001

(54) SNAP-ON RACK SLIDE MOUNTING SYSTEM

(75) Inventor: Ryan Abbott, Cupertino, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/428,120

(22) Filed: Oct. 27, 1999

(51) Int. Cl.[7] ........................................ A47F 5/00
(52) U.S. Cl. ................ 211/26; 211/190; 312/334.4; 312/265.4; 361/829
(58) Field of Search ............................ 211/26, 187, 190; 312/265.1, 265.2, 265.3, 265.4, 265.5, 334.4; 361/829

(56) References Cited

U.S. PATENT DOCUMENTS

| 3,133,768 | * | 5/1964 | Klakovich . | |
| 5,571,256 | * | 11/1996 | Good et al. | 211/26 |
| 5,833,337 | * | 11/1998 | Kofstad | 312/334.4 |
| 5,941,621 | * | 8/1999 | Boulay et al. | 312/334.4 |
| 6,021,909 | * | 2/2000 | Tang et al. | 211/190 X |
| 6,042,206 | * | 3/2000 | Bowyer et al. | 312/334.4 |
| 6,070,957 | * | 6/2000 | Zachrai | 312/334.4 |

* cited by examiner

Primary Examiner—Robert W Gibson, Jr.
(74) Attorney, Agent, or Firm—Manuel Quiogue

(57) ABSTRACT

A rack slide assembly for supporting a computer enclosure in a rack system having apertured column flanges. The rack slide assembly includes a slide mechanism having an outer channel and an inner channel that are translatable relative to each other along a longitudinal axis of the slide mechanism. A first mounting bracket having a mounting flange is affixed to the outer channel with the mounting flange adjacent a first end of the outer channel, while a second mounting bracket is slidably attached to the outer channel with the mounting flange adjacent a second end of the outer channel. The second mounting bracket is movable relative to the outer channel along the longitudinal axis of the slide mechanism. Rack mounting pins are disposed on the mounting flanges, and a locking mechanism is provided for selectively positionally locking the second mounting bracket relative to the outer channel. Each of the rack mounting pins includes first and second sections of different sizes arranged in succession along a pin axis, which allows for installation of the rack slide assembly in rack systems respectively having different rack aperture sizes.

20 Claims, 5 Drawing Sheets

SNAP-ON RACK SLIDE MOUNTING SYSTEM

BACKGROUND OF THE INVENTION

The disclosed invention relates generally to electronic equipment rack systems, and more particularly to a rack mount assembly that is installed without tools and adaptable to various rack systems.

An electronic equipment rack system is an equipment supporting structure that includes four vertically oriented support columns, each having an apertured column flange. The support columns are fixedly located relative to each other so as to be at the corners of a rectangle, whereby two support columns are at a front of the rack system while two support columns are at a rear of the rack system. Thus, each of left and right sides of the rack system includes a front support column and a rear support column.

A left side rack mount assembly and a right side rack mount assembly are mounted horizontally opposite and parallel to each other on the left and right sides of the rack system to support a piece of electronic equipment to be installed in the rack system. Such left and right rack mount assemblies extend back to front, and include respective support panels or shelves that are attachable to an enclosure or chassis of the electronic equipment being supported in the rack system. The rack mount assemblies can comprise rack slide assemblies whereby the electronic equipment is slidably supported in the rack system so that the electronic equipment can be slid forwardly for access.

Typically, the rack mount assemblies are attached to the column flanges by rack nuts and bolts. Rack nuts are installed adjacent selected apertures in the column flanges, and bolts are passed through apertures in mounting brackets of the rack mount assemblies and threaded into the rack nuts.

A consideration with conventional installation of rack mount assemblies is difficulty of installation. If only one person is performing the installation, that person supports the rack mount assembly with one hand while installing bolts with the other hand. If two persons are performing the installation, one person supports the rack mount assembly while the other person installs bolts. Either way is awkward.

There is accordingly a need for a rack mount assembly that is easily installed.

SUMMARY OF THE INVENTION

The disclosed invention is directed to a rack mount assembly that includes a rack mount mechanism, a first mounting flange fixedly connected to the rack mount mechanism and located adjacent a first end of the rack mount mechanism, and a second mounting flange is slidably connected to the rack mount mechanism and located adjacent a second end of the rack mount mechanism. The second mounting flange is movable relative to the along a longitudinal axis of the rack mount mechanism. Rack mounting pins are anchored to the mounting flanges, and a locking mechanism is provided for selectively positionally locking the second mounting flange relative to the rack mount mechanism. By way of illustrative example, the rack mount mechanism comprises a rack slide mechanism.

In accordance with a further aspect of the invention, each of the rack mounting pins includes first and second sections of different sizes arranged in succession along a pin axis, which allows for installation of the rack mount assembly in rack systems respectively having different rack aperture sizes.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
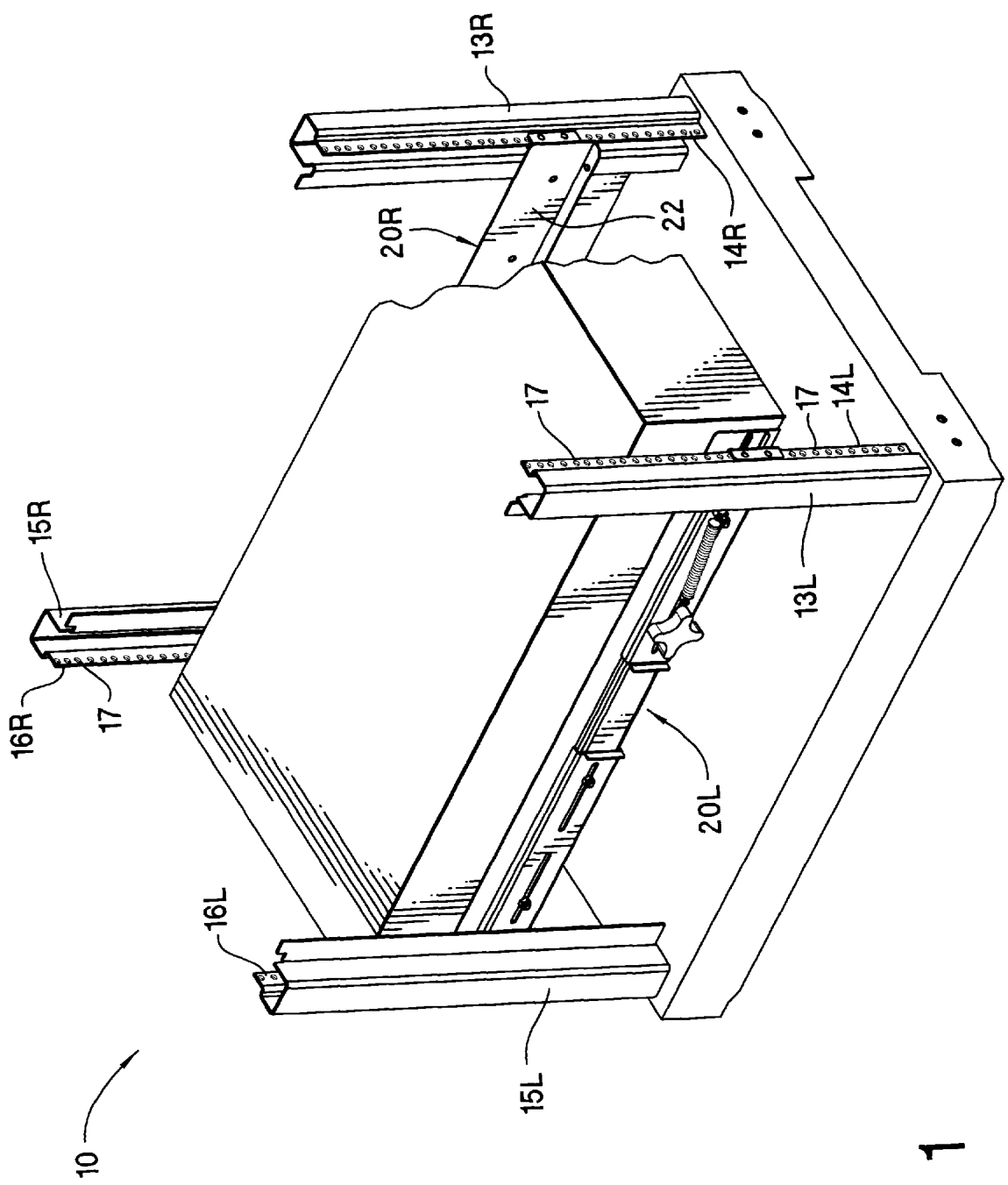
FIG. 1 is a schematic isometric view of a computer equipment rack system that employs rack mount assemblies in accordance with the invention.

In the following detailed description and in the several figures of the drawing, like elements are identified with like reference numerals.

Referring now to the FIG. 1, set forth therein is a schematic perspective view of rack system 10 that incorporates a left rack slide assembly 20L and a right side rack slide assembly 20R in accordance with the invention. The rack system 10 more particularly includes a frame comprised of front columns 13L, 13R and rear columns 15L, 15R. The front columns 13L, 13R respectively include left and right front column flanges 14L, 14R in which are formed apertures 17, and the rear columns 15L, 15R also respectively include left and right rear support flanges 16L, 16R in which are formed apertures 17. Conventionally, the front column flanges 14L, 14R are coplanar, and the rear flanges 16L, 16R are coplanar. Also conventionally, the column flanges when viewed from above are located at the vertexes of a rectangle.

In accordance with the invention, each of the rack slide assemblies 20L and 20R includes a spring biased bracket that allows for easy installation without tools in a snap-on manner of the rack slide assemblies 20L and 20R to left front and rear columns 13L, 15L and to right front and the rear columns 13R, 15L of a respective side of the rack system. By way of illustrative example, the right slide assemblies 20L, 20R have respective L-channels 22 that are secured to inner channels of the slide assemblies (described further herein) for supporting a computer equipment enclosure 11 that is placed on and secured to the L-channels after the rack slide assemblies 20L, 20R are installed in the rack system.

The rack slide assemblies 20L and 20R are mirror images of each other, and thus it would be sufficient to describe the rack slide assembly 20L to illustrate the features of the invention.

Figure 2:
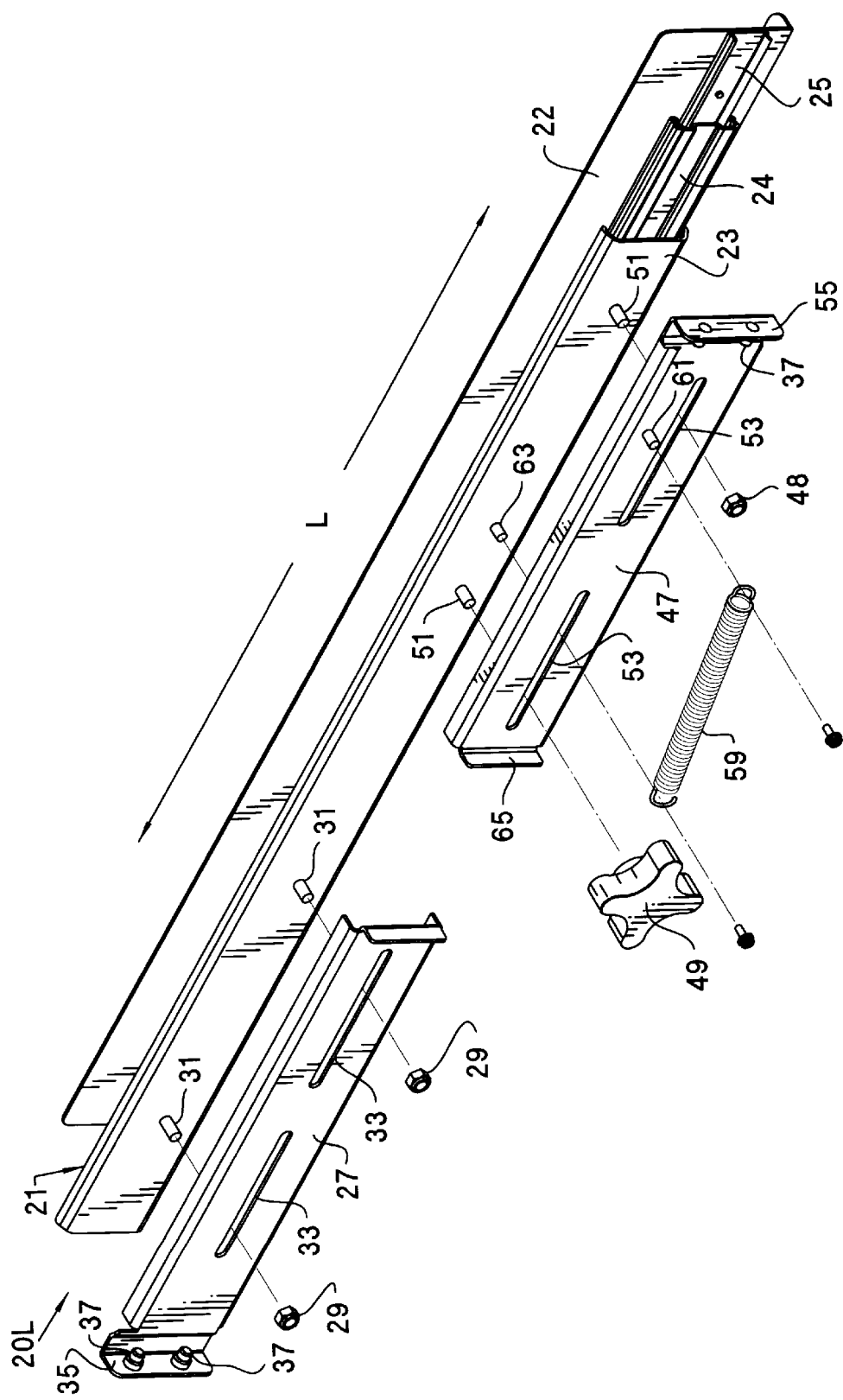
FIG. 2 is a schematic exploded isometric view of a rack mount assembly in accordance with the invention.

Referring now to FIG. 2, the rack slide assembly 20L more particularly includes a conventional multiple-channel slide mechanism 21 comprised of an outer channel 23, a middle channel 24 that is slidably attached to the outer channel for translational movement relative to the outer channel along a longitudinal axis L of the slide mechanism, and an inner channel 25 that is slidably attached to the middle channel 24 for translational movement relative to the middle channel 24 along the longitudinal axis L of the slide mechanism. A first mounting bracket 27 is attached to the outer channel 23 generally at a first end thereof by nuts 29 that are threadably secured onto studs 31 that are anchored to the outer channel and pass through elongated slots 33 in the first mounting bracket 27. The studs 31 and the elongated slots 33 are configured such that the first mounting bracket 27 can be adjusted along the longitudinal axis L relative to the outer channel 23. The position of the first mounting bracket 27 relative to the outer channel 23 is fixed by tightening the nuts 29.

The first mounting bracket 27 further includes a mounting flange 35 at an end of the mounting bracket 27 that is in the vicinity of the first end of the outer channel 23. The mounting flange 35 is generally orthogonal to the longitudinal axis L of the slide mechanism 21, and rack mounting pins 37 are secured to the mounting flange 35 for engagement in selected rack apertures 17 in the left rear column flange 16L of the rack system. By way of illustrative example, the rack mounting pins 37 extend inwardly. The spacing of the rack mounting pins 35 corresponds to the spacing of the apertures 17 in the column flanges of the rack system.

A second mounting bracket 47 is slidably attached to the outer channel 23 generally at a second end thereof by a nut 48 and a knob 49 that are threadably attached onto studs 51 that are anchored to the outer channel 23 and pass through elongated slots 53 in the second mounting bracket 47. The nut 48 is attached so as to slidably retain the second mounting bracket 47, while the knob is controllably hand tightened to fix the position of the second mounting bracket 47 relative to the outer channel 23. The studs 51 and the elongated slots 53 are configured such that the second mounting bracket 47 is slidable along the longitudinal axis L relative to the outer channel 23. Thus, if the knob 49 is threadably loosened the second mounting bracket 47 is movable along the longitudinal axis L relative to the outer channel 23.

The second mounting bracket 47 further includes a mounting flange 55 at an end of the second mounting bracket 47 that is in the vicinity of the second end of the outer channel 23. The mounting flange 55 is generally orthogonal to the longitudinal axis L of the slide mechanism 21, and rack mounting pins 37 are secured to the mounting flange 55 for engagement in selected rack apertures 17 in the left front column flange 14L of the rack system. By way of illustrative example, the rack mounting pins 57 extend inwardly, whereby the rack mounting pins 37 of the first mounting bracket 27 extend toward the rack mounting pins 37 of the second mounting bracket 47 and the rack mounting pins 37 of the second mounting bracket 47 extend toward the rack mounting pins 37 of the first mounting bracket 27. In other words, the rack mounting pins 37 of the first mounting bracket 27 extend towards the mounting flange 55 of the second mounting bracket 47, while the mounting pins 37 of the second mounting bracket 47 extend towards the mounting flange 35 of the first mounting bracket 27. The spacing of the rack mounting pins 37 secured to the flange 55 corresponds to the spacing of the apertures 17 of the column flanges of the rack system.

The second mounting bracket 45 is biased toward the center portion of the slide mechanism by a tension spring 59 that is connected between a standoff 61 that is anchored to the second mounting bracket 47 and a standoff 63 that is attached to the outer channel 23 and extends through the elongated slot 53. The standoff 61 is located closer to the mounting flange 55, while the standoff 63 is located closer to the center portion of the slide mechanism 21.

A grip flange 65 is located at the other end of the second mounting bracket 47 to facilitate manual extension of the second mounting bracket 47 against the tension of the spring 59.

Figure 3A:
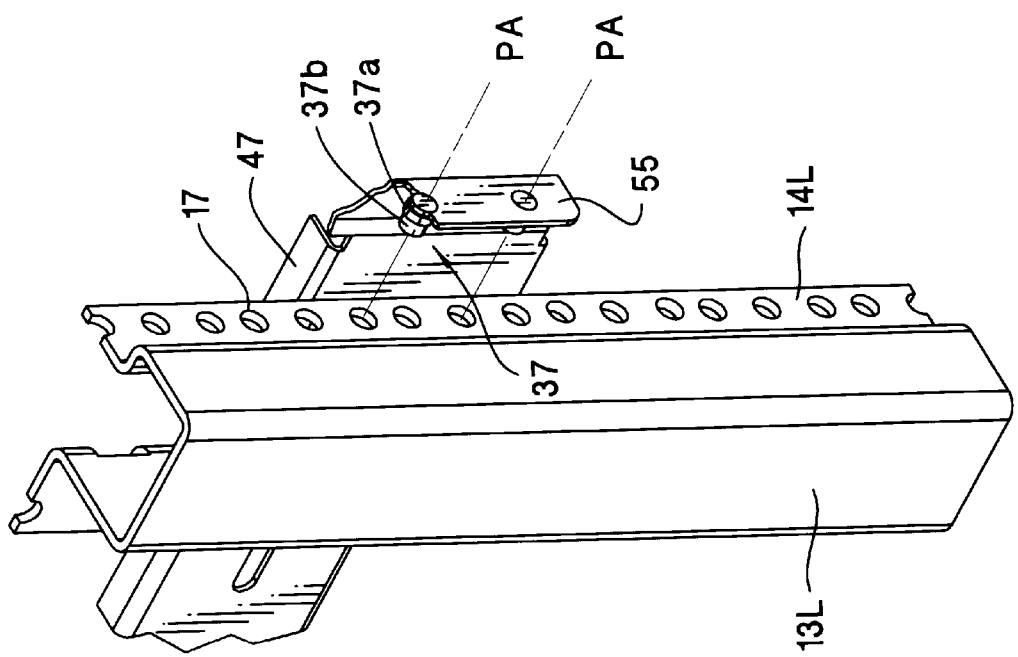
FIG. 3A is a schematic isometric view illustrating an implementation of rack mounting pins in accordance with the invention.
Figure 3B:
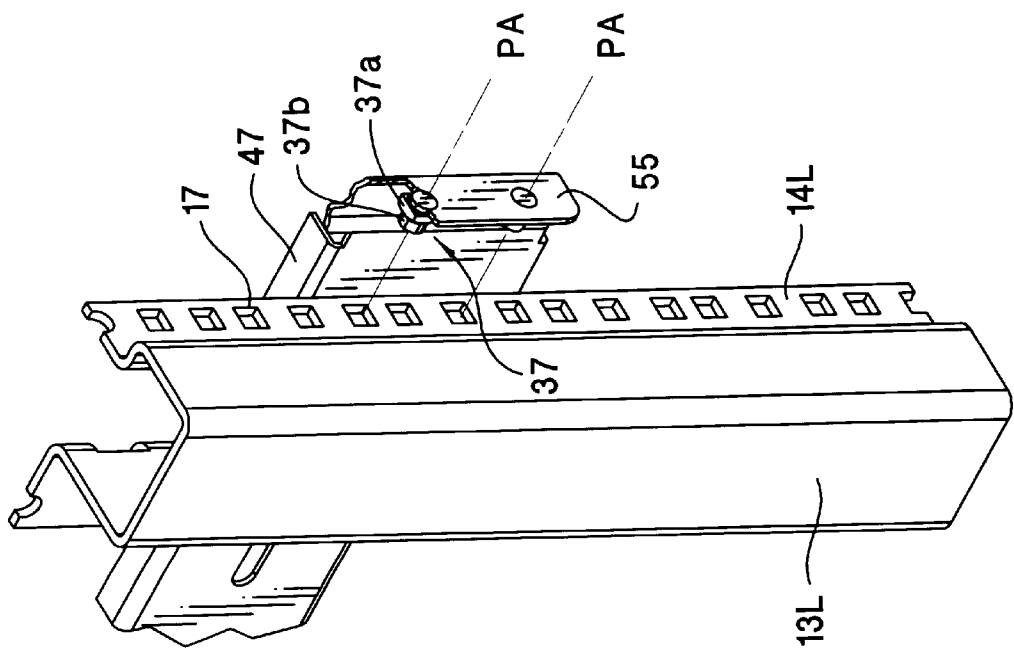
FIG. 3B is a schematic isometric view illustrating another implementation of rack mounting pins in accordance with the invention.
Figure 4:
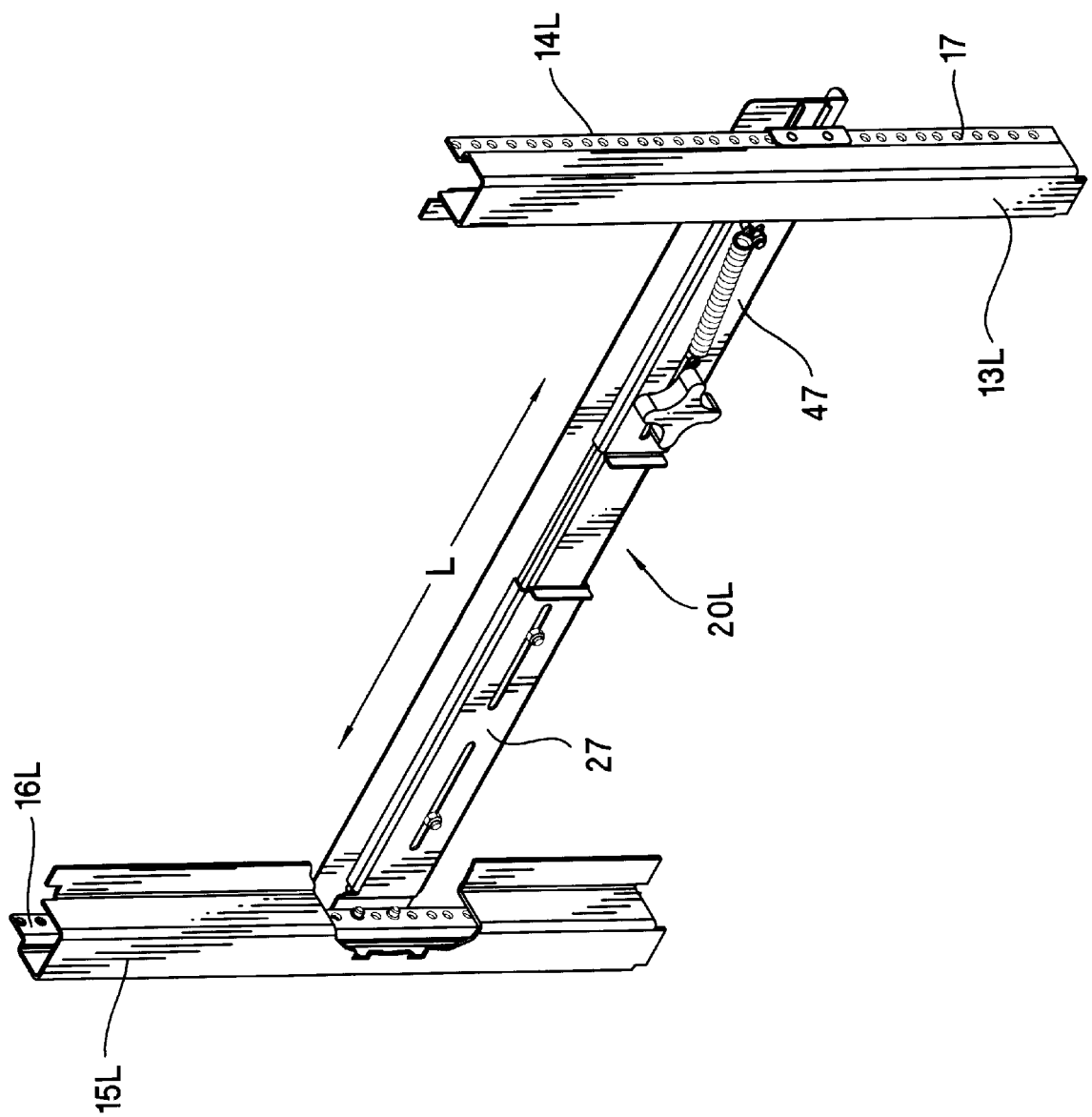
FIG. 4 is a schematic isometric view showing the rack mount assembly of FIG. 2 as installed in the rack system of FIG. 1.

In use, the rack slide assembly 20L is installed in the rack columns by first engaging the pins 37 of the first mounting bracket 27 in selected apertures 17 of the left rear column flange 16L from behind such column flange. The second bracket 47 is then extended against the tension of the spring 59, and the pins 37 of the second mounting bracket 47 are positioned outside selected apertures 17 of the left front column flange 14L that is opposite the left rear column flange 16L in which the pins of the first mounting bracket 27 were previously engaged, as generally shown in FIGS. 3A and 3B. The second mounting bracket 47 is allowed to retract pursuant to the bias of the spring 59 to allow the pins 37 of the second mounting bracket 47 to engage the selected apertures 17 in the left front column flange 14L, as shown in FIG. 4. The knob 49 is tightened to fixedly secure the second mounting bracket 47 to the outer channel 23.

In accordance with a further aspect of the invention, as illustrated in FIGS. 3A and 3B, each of the pins 37 is comprised of two co-axial sections 37a, 37b arranged in succession along a pin axis PA that is parallel to the longitudinal L of the slide mechanism 21 when the mounting bracket having the pin is attached to the slide mechanism. Each of the sections 37a, 37b has a maximum lateral dimension that is orthogonal to the pin axis PA (and the longitudinal axis L when the mounting brackets 27, 47 are attached to the slide mechanism 21), and the maximum lateral dimension of the section 37a that is closest to the flange 35 or 55 is greater than the maximum lateral dimension of the section 37b. For the particular example wherein the pin sections 37a, 37b comprise coaxial adjacently positioned cylinders, illustrated in FIG. 3A, the maximum lateral dimension is a diameter of a cylinder. For another example wherein the section 37a has a square cross section orthogonal to the pin axis A, as shown in FIG. 3B, the maximum lateral dimension is a diagonal. Stated another way, as to both embodiments, the lateral cross-sectional area of the section 37a as taken orthogonally to the pin axis PA is greater than the lateral cross sectional area of the section 37b as taken orthogonally to the pin axis A.

By having stepped pins, the rack slide assembly of the invention can be utilized without modification with rack systems having different aperture sizes. For example, a slide assembly having pins wherein both pin sections are cylindrical can be used with rack systems having smaller round apertures 17 as well as rack systems having larger round apertures 17 or square apertures 17. A slide assembly having pins wherein one section is square while the other section is cylindrical can be used with rack systems having smaller round apertures 17 as well as rack systems having square apertures 17.

Figure 5:
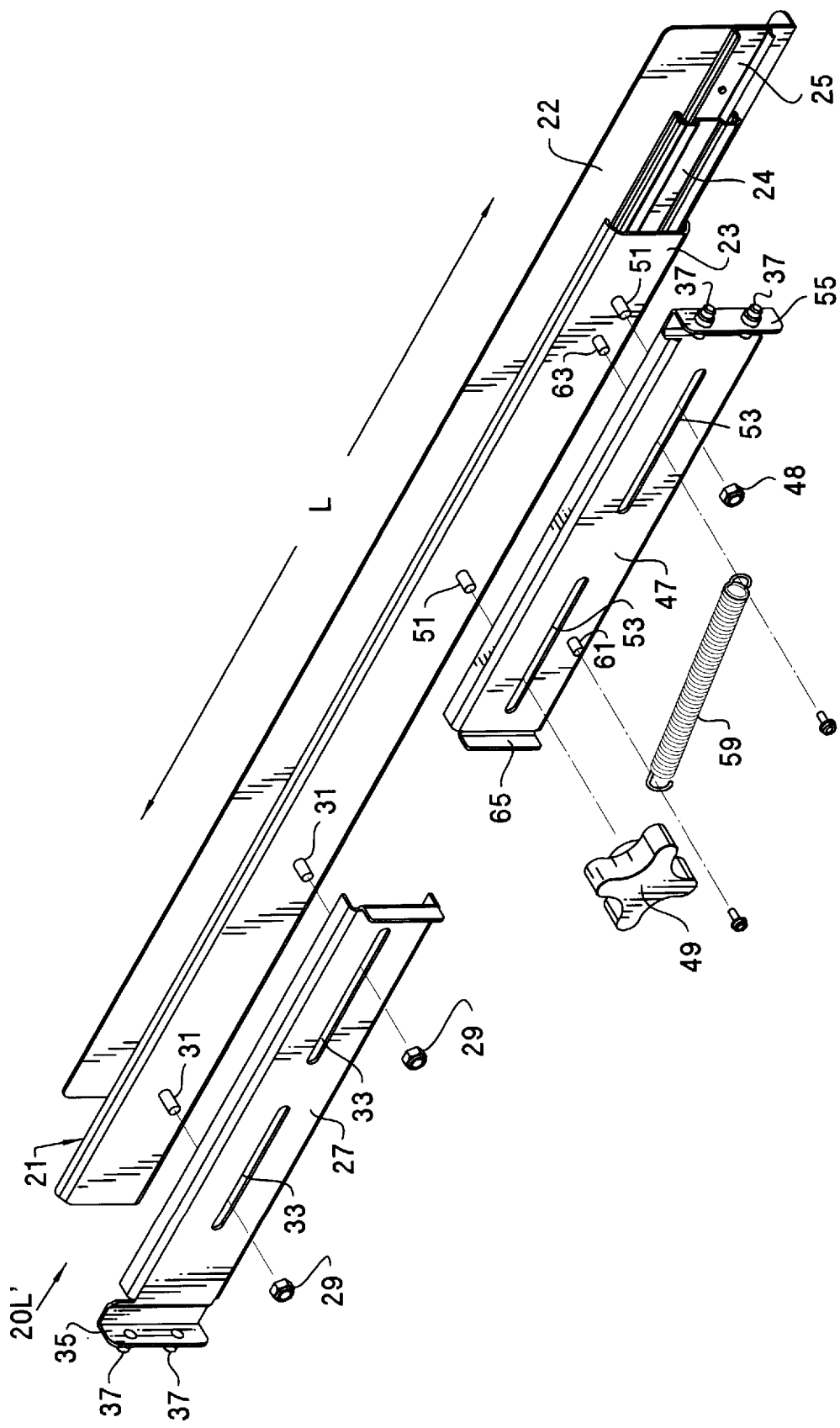
FIG. 5 is a schematic exploded isometric view of another rack mount assembly in accordance with the invention.

Referring now to FIG. 5 schematically illustrated therein is another embodiment of a slide assembly 20L' in accordance with the invention. The slide assembly 20L' is similar to the slide assembly 20L of FIG. 2, except for mounting pins 37 that extend outwardly, and a second mounting bracket 47 that is biased by a spring 59 to extend outwardly away from the center portion of the slide mechanism 21. In other words, the pins 37 on the mounting flange 35 extend away from the pins 37 on the mounting flange 55, and the pins 37 on the mounting flange 55 extend away from the pins 37 on the mounting flange 37. The spring 59 is secured by a standoff 61 that is anchored to the second mounting bracket 47 and a standoff 63 that is attached to the outer channel 23 and extends through the elongated slot 53. The standoff 61 is located closer to the center portion of the slide mechanism 21, while the standoff 63 is located closer to the mounting flange 55.

In use, the slide assembly 20L' is installed in the rack system by first engaging the pins 37 of the first mounting bracket 27 in selected apertures 17 of the left rear column flange 16L from ahead of such support rail. The second mounting bracket 47 is then retracted against the tension of the spring 59, and the pins 37 of the second mounting bracket 47 are positioned inside mounting apertures 17 of the left front column flange 14L that is opposite the left rear column flange 16L in which the pins 37 of the first mounting bracket 27 were previously engaged. The second mounting bracket 47 is allowed to extend to allow the pins 37 of the second mounting bracket 47 to engage the selected apertures 17 in the left front column flange 14L. The knob 47 is tightened to fixedly secure the second mounting bracket 47 to the outer channel 23.

The disclosed rack mount assembly thus generally includes a rack mount mechanism, a first mounting flange that is fixedly connected to a first end of the rack mount mechanism, a spring biased second mounting flange that is slidably connected to the rack mount mechanism and located adjacent a second end of the rack mount mechanism, and mounting pins anchored in the first and second mounting flanges, and a locking mechanism for locking the second mounting flange relative to the rack mount mechanism.

The foregoing has been a disclosure of a rack mount assembly that is readily installed in a snap-in manner by one person without tools, and in accordance with a further aspect of the invention is usable without modification with rack systems of different mounting aperture dimensions.

Although the foregoing has been a description and illustration of specific embodiments of the invention, various modifications and changes thereto can be made by persons skilled in the art without departing from the scope and spirit of the invention as defined by the following claims.

What is claimed is:

1. A rack slide assembly comprising:
    a slide mechanism having an outer channel and an inner channel, said outer channel having a first end and a second end, and said inner channel and said outer channel being translatable relative to each other along a longitudinal axis of said slide mechanism;
    a first mounting bracket affixed to said outer channel and having a mounting flange adjacent said first end of said outer channel and orthogonal to said longitudinal axis;
    first rack pins disposed on said mounting flange of said first mounting bracket;
    a second mounting bracket slidably attached to said outer channel for movement relative to said outer channel along said longitudinal axis and having a mounting flange adjacent said second end of said outer channel and orthogonal to said longitudinal axis;
    second rack pins disposed on said mounting flange of said second mounting bracket;
    said first rack pins extending along said longitudinal axis toward said second mounting bracket, and said second rack pins extending along said longitudinal axis toward said first mounting bracket;
    each of said first rack pins and said second rack pins comprising a pin having a first section and a second section arranged in succession along a pin axis, wherein a lateral dimension of said first section orthogonal to said pin axis is greater than a lateral dimension of said second section orthogonal to said pin axis;
    a biasing element that biases said second mounting bracket toward said first mounting bracket; and
    a locking mechanism for selectively locking said second mounting bracket relative to said outer channel.

2. The rack slide assembly of claim 1 wherein said first section has circular cross section orthogonal to said pin axis and wherein said second section has circular cross section orthogonal to said pin axis.

3. The rack slide assembly of claim 1 wherein said first section has square cross section orthogonal to said pin axis and wherein said second section has circular cross section orthogonal to said pin axis.

4. A rack slide assembly comprising:
    a slide mechanism having an outer channel and an inner channel, said outer channel having a first end and a second end, and said inner channel and said outer channel being translatable relative to each other along a longitudinal axis of said slide mechanism;
    a first mounting bracket affixed to said outer channel and having a mounting flange adjacent said first end of said outer channel and orthogonal to said longitudinal axis;
    first rack pins disposed on said mounting flange of said first mounting bracket;
    a second mounting bracket slidably attached to said outer channel for movement relative to said outer channel along said longitudinal axis and having a mounting flange adjacent said second end of said outer channel and orthogonal to said longitudinal axis;
    second rack pins disposed on said mounting flange of said second mounting bracket;
    said first rack pins extending along said longitudinal axis away from said second mounting bracket, and said second rack pins extending along said longitudinal axis away from said first mounting bracket;
    each of said first rack pins and said second rack pins comprising a pin having a first section and a second section arranged in succession along a pin axis, wherein a lateral dimension of said first section orthogonal to said pin axis is greater than a lateral dimension of said second section orthogonal to said pin axis;
    a biasing element that biases said second mounting bracket away from said first mounting bracket; and
    a locking mechanism for selectively locking said second mounting bracket relative to said outer channel.

5. The rack slide assembly of claim 4 wherein said first section has circular cross section orthogonal to said pin axis and wherein said second section has circular cross section orthogonal to said pin axis.

6. The rack slide assembly of claim 4 wherein said first section has square cross section orthogonal to said pin axis and wherein said second section has circular cross section orthogonal to said pin axis.

7. A rack mount assembly comprising:
    a rack mount mechanism having a first end and a second end, and further having a longitudinal axis;
    a first mounting flange adjacent said first end of said rack mount mechanism and fixedly connected to said rack mount mechanism, said first mounting flange being orthogonal to said longitudinal axis;

first rack pins disposed on said first mounting flange;

a second mounting flange adjacent said second end of said rack mount mechanism and slidably connected to said rack mount mechanism for movement relative to said rack mount mechanism along the longitudinal axis of said rack mount mechanism;

second rack pins disposed on said second mounting flange; and said first rack pins extending along said longitudinal axis toward said second mounting flange, and said second rack pins extending along said longitudinal axis toward said first mounting flange;

each of said first rack pins and said second rack pins comprising a pin having a first section and a second section arranged in succession along a pin axis, wherein a lateral dimension of said first section orthogonal to said pin axis is greater than a lateral dimension of said second section orthogonal to said pin axis;

a biasing element that biases said second mounting flange toward said first mounting flange; and a locking mechanism for selectively locking said second mounting flange relative to said rack mount mechanism.

8. The rack mount assembly of claim 7 wherein said first section has circular cross section orthogonal to said pin axis and wherein said second section has circular cross section orthogonal to said pin axis.

9. The rack mount assembly of claim 7 wherein said first section has square cross section orthogonal to said pin axis and wherein said second section has circular cross section orthogonal to said pin axis.

10. A rack mount assembly comprising:

a rack mount mechanism having a first end and a second end, and further having a longitudinal axis;

a first mounting flange adjacent said first end of said rack mount mechanism and fixedly connected to said rack mount mechanism, said first mounting flange being orthogonal to said longitudinal axis;

first rack pins disposed on said first mounting flange;

a second mounting flange adjacent said second end of said rack mount mechanism and slidably connected to said rack mount mechanism for movement relative to said rack mount mechanism along the longitudinal axis of said rack mount mechanism;

second rack pins disposed on said second mounting flange;

said first rack pins extending along said longitudinal axis away from said second mounting flange, and said second rack pins extending along said longitudinal axis away from said first mounting flange;

each of said first rack pins and said second rack pins comprising a pin having a first section and a second section arranged in succession along a pin axis, wherein a lateral dimension of said first section orthogonal to said pin axis is greater than a lateral dimension of said second section orthogonal to said pin axis;

a biasing element that biases said second mounting flange away from said first mounting flange; and a locking mechanism for selectively locking said second mounting flange relative to said rack mount mechanism.

11. The rack mount assembly of claim 10 wherein said first section has circular cross section orthogonal to said pin axis and wherein said second section has circular cross section orthogonal to said pin axis.

12. The rack mount assembly of claim 10 wherein said first section has square cross section orthogonal to said pin axis and wherein said second section has circular cross section orthogonal to said pin axis.

13. A rack slide assembly comprising:

a slide mechanism having an outer channel and an inner channel, said outer channel having a first end and a second end, and said inner channel and said outer channel being translatable relative to each other along a longitudinal axis of said slide mechanism;

a first mounting bracket affixed to said outer channel and having a mounting flange adjacent said first end of said outer channel;

first rack pins disposed on said mounting flange of said first mounting bracket;

a second mounting bracket slidably attached to said outer channel for movement relative to said outer channel along said longitudinal axis and having a mounting flange adjacent said second end of said outer channel;

second rack pins disposed on said mounting flange of said second mounting bracket;

each of said first rack pins and said second rack pins comprising a pin having a first section and a second section arranged in succession along a pin axis, wherein a lateral dimension of said first section orthogonal to said pin axis is greater than a lateral dimension of said second section orthogonal to said pin axis; and a locking mechanism for selectively locking said second mounting bracket relative to said outer channel.

14. The rack slide assembly of claim 13 wherein said first section has circular cross section orthogonal to said pin axis and wherein said second section has circular cross section orthogonal to said pin axis.

15. The rack slide assembly of claim 13 wherein said first section has square cross section orthogonal to said pin axis and wherein said second section has circular cross section orthogonal to said pin axis.

16. The rack slide assembly of claim 13 wherein said locking mechanism includes a manually rotatable knob.

17. A rack mount assembly comprising:

a rack mount mechanism having a first end and a second end, and further having a longitudinal axis;

a first mounting flange adjacent said first end of said rack mount mechanism and fixedly connected to said rack mount mechanism, said first mounting flange being orthogonal to said longitudinal axis;

first rack pins disposed on said first mounting flange;

a second mounting flange adjacent said second end of said rack mount mechanism and slidably connected to said rack mount mechanism for movement relative to said rack mount mechanism along the longitudinal axis of said rack mount mechanism;

second rack pins disposed on said second mounting flange;

each of said first rack pins and said second rack pins comprising a pin having a first section and a second section arranged in succession along a pin axis, wherein a lateral dimension of said first section orthogonal to said pin axis is greater than a lateral dimension of said second section orthogonal to said pin axis; and a locking mechanism for selectively locking said second mounting flange relative to said rack mount mechanism.

18. The rack mount assembly of claim 17 wherein said first section has circular cross section orthogonal to said pin axis and wherein said second section has circular cross section orthogonal to said pin axis.

19. The rack mount assembly of claim 17 wherein said first section has square cross section orthogonal to said pin axis and wherein said second section has circular cross section orthogonal to said pin axis.

20. The rack slide assembly of claim 17 wherein said locking mechanism includes a manually rotatable knob.

* * * * *